United States Patent
Kang et al.

(10) Patent No.: US 9,390,860 B2
(45) Date of Patent: Jul. 12, 2016

(54) MULTILAYER CERAMIC ELECTRONIC COMPONENT, METHOD OF MANUFACTURING THE SAME, AND BOARD HAVING THE SAME MOUNTED THEREON

(71) Applicant: SAMSUNG ELECTRO-MECHANICS CO., LTD., Suwon-Si, Gyeonggi-Do (KR)

(72) Inventors: Sim Chung Kang, Suwon-Si (KR); Seung Hee Yoo, Suwon-Si (KR); Kyung Pyo Hong, Suwon-Si (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 55 days.

(21) Appl. No.: 14/332,003

(22) Filed: Jul. 15, 2014

(65) Prior Publication Data

US 2015/0187500 A1    Jul. 2, 2015

(30) Foreign Application Priority Data

Dec. 30, 2013  (KR) .................. 10-2013-0166899

(51) Int. Cl.
  *H01G 4/005*  (2006.01)
  *H01G 4/228*  (2006.01)
  (Continued)

(52) U.S. Cl.
  CPC .............. *H01G 4/30* (2013.01); *H01G 2/065* (2013.01); *H01G 4/2325* (2013.01); *H01G 4/12* (2013.01); *H05K 1/181* (2013.01); *H05K 2201/10015* (2013.01)

(58) Field of Classification Search
  CPC ........... H01G 4/30; H01G 4/012; H01G 4/12; H05K 1/09; H05K 1/181; H05K 2201/10015
  USPC .................. 174/260; 361/303, 309
  See application file for complete search history.

(56) References Cited

U.S. PATENT DOCUMENTS

| 8,174,816 B2 * | 5/2012 | Seo ................ H01G 4/232 361/301.4 |
| 8,861,180 B2 * | 10/2014 | Lee ................ H01G 4/008 361/301.2 |

(Continued)

FOREIGN PATENT DOCUMENTS

| JP | 2007-149522 A | 6/2007 |
| JP | 2010-165594 A | 7/2010 |

(Continued)

OTHER PUBLICATIONS

Office Action issued on Dec. 8, 2015 in related Japanese Application No. 2014-141228 (English Translation provided).

*Primary Examiner* — Hoa C Nguyen
(74) *Attorney, Agent, or Firm* — McDermott Will & Emery LLP

(57) ABSTRACT

A multilayer ceramic electronic component may include a ceramic body including dielectric layers and internal electrodes, electrode layers connected to the internal electrodes, and a conductive resin layer formed on the electrode layers and including a first conductor, a second conductor containing carbon nanotubes, and a base resin. When the multilayer ceramic electronic component is heat-tested by raising a temperature of the multilayer ceramic electronic component from room temperature to about 900° C. at a rate of about 10° C./min, a weight of the multilayer ceramic electronic component decreases by about 0.33% to about 2.19%.

23 Claims, 8 Drawing Sheets

(51) Int. Cl.
  *H01G 4/30* (2006.01)
  *H01G 2/06* (2006.01)
  *H01G 4/232* (2006.01)
  H01G 4/12 (2006.01)
  H05K 1/18 (2006.01)

(56) References Cited

U.S. PATENT DOCUMENTS

| | | | | | |
|---|---|---|---|---|---|
| 2004/0240146 | A1* | 12/2004 | Kayatani | ............... | H01G 2/103 361/306.3 |
| 2005/0104932 | A1* | 5/2005 | Tsuruoka | ............... | B41J 2/1433 347/47 |
| 2006/0238948 | A1* | 10/2006 | Tominaga | ............... | H01G 4/232 361/118 |
| 2009/0121195 | A1* | 5/2009 | Lee | ............... | B82Y 10/00 252/503 |
| 2009/0230363 | A1* | 9/2009 | Lee | ............... | B82Y 10/00 252/512 |
| 2010/0302704 | A1 | 12/2010 | Ogawa et al. | | |
| 2012/0132865 | A1* | 5/2012 | Nakamura | ............. | B82Y 30/00 252/511 |
| 2012/0231248 | A1* | 9/2012 | Sato | ............... | B32B 27/308 428/213 |
| 2012/0232866 | A1* | 9/2012 | Curatolo | ............... | G06F 17/50 703/2 |
| 2013/0294006 | A1 | 11/2013 | Kang et al. | | |
| 2013/0300020 | A1* | 11/2013 | Leibler | ............... | B29B 17/0042 264/115 |
| 2014/0306164 | A1* | 10/2014 | Restuccia | ............... | C08K 3/04 252/511 |

FOREIGN PATENT DOCUMENTS

| | | |
|---|---|---|
| JP | 2010-278373 A | 12/2010 |
| JP | 2013-235807 A | 11/2013 |
| KR | 10-0586962 A | 6/2006 |
| KR | 10-2010-0110891 A | 10/2010 |
| KR | 10-2013-0046100 A | 5/2013 |

* cited by examiner

MULTILAYER CERAMIC ELECTRONIC COMPONENT, METHOD OF MANUFACTURING THE SAME, AND BOARD HAVING THE SAME MOUNTED THEREON

CROSS-REFERENCE TO RELATED APPLICATION

This application claims the benefit of Korean Patent Application No. 10-2013-0166899 filed on Dec. 30, 2013, with the Korean Intellectual Property Office, the disclosure of which is incorporated herein by reference.

TECHNICAL FIELD

The present technology generally relates to a multilayer ceramic electronic component, a method of manufacturing the same, and a board having the same mounted thereon.

BACKGROUND

Unless otherwise indicated herein, the materials described in this section are not prior art to the claims herein and are not admitted to be prior art by inclusion in this section.

A multilayer ceramic electronic component commonly includes a plurality of stacked dielectric layers, internal electrodes disposed to face each other, having dielectric layers interposed therebetween, and external electrodes electrically connected to respective internal electrodes.

Such a multilayer ceramic electronic component has been widely used as a component in a computer, a mobile communication device such as a personal digital assistant (PDA), a mobile phone or the like, due to inherent advantages such as a small size, high capacitance, ease of mounting, and the like.

As electronic products have been miniaturized and implemented with multi-functionality, chip components have also tended to be miniaturized and multi-functionalized. Therefore, small sized multilayer ceramic electronic components having high levels of capacitance are in demand.

To this end, a multilayer ceramic electronic component has been manufactured in which a size thereof is not increased, but in which an increased number of dielectric layers are stacked, through decreasing thicknesses of the dielectric layers and internal electrode layers, and thinning external electrodes.

In addition, as various elements of devices and apparatuses commonly used in fields requiring high degrees of reliability, such as vehicles and medical devices, are digitalized and demands thereon are increased, high degrees of reliability are also required in multilayer ceramic electronic components in accordance therewith.

As factors causing difficulties in the realization of high degrees of reliability, the infiltration of a plating solution into a ceramic main body of a multilayer ceramic electronic component, occurring at the time of a manufacturing process thereof, the generation of cracks due to external impacts, and the like, may be problematic.

Therefore, as a means for solving such problems, a resin composition containing a conductive material may be applied to an electrode layer of an external electrode of a multilayer ceramic electronic component in order to absorb external impacts and to prevent the infiltration of a plating solution thereinto, thereby improving product reliability.

However, in the case of applying a conductive resin layer to the electrode layer of a multilayer ceramic electronic component, a problem in which equivalent series resistance (ESR) increases may occur, such that a multilayer ceramic electronic component, in which such issues are not present, is required.

SUMMARY

Some embodiments of the present disclosure may provide a multilayer ceramic electronic component, a method of manufacturing the same, and a board having the same mounted thereon.

According to some embodiments of the present disclosure, a multilayer ceramic electronic component is provided comprising a ceramic body including dielectric layers and internal electrodes. Electrode layers are connected to the internal electrodes. A conductive resin layer is formed on the electrode layers and includes a first conductor, a second conductor containing carbon nanotubes, and a base resin is applied to the electrode layers. When the multilayer ceramic electronic component is heat-tested by raising a temperature of the multilayer ceramic electronic component from room temperature to about 900° C. at a rate of about 10° C./min, a weight of the multilayer ceramic electronic component decreases by about 0.33% to about 2.19%.

When a weight decrease rate at the time of performing a heat test of the multilayer ceramic electronic component by the raising the temperature of the multilayer ceramic electronic component from a room temperature to about 900° C. at the rate of about 10° C./min is defined as A, and a weight decrease rate at the time of performing a heat test of a comparative electronic part containing a first conductor and a base resin at the same ratio as those in the multilayer ceramic electronic component, but not containing a second conductor, by raising a temperature thereof from room temperature to about 900° C. at the rate of about 10° C./min is defined as B, A/B may be about 1.43 to about 9.52.

A temperature-weight graph illustrating the heat-testing step may have an inflection point, and the inflection point may be present in a temperature range of about 300° C. to about 500° C.

The conductive resin layer may have a carbon nanotube content of about 0.5 vol % to about 10 vol %.

The conductive resin layer may contain the base resin and the carbon nanotubes at a volume ratio of base resin:carbon nanotubes of about 100:1 to about 100:20.

The conductive resin layer may have a content of the first conductor of about 33 vol % to about 60 vol %.

When diameters of the carbon nanotubes are defined as D, D may be in a range of about 1 nm to about 100 nm (1 nm≤D≤100 nm).

The first conductor may be spherical or flake-shaped.

According to some embodiments of the present disclosure, a multilayer ceramic electronic component includes a ceramic body including dielectric layers and internal electrodes, electrode layers connected to the internal electrodes, and a conductive resin layer formed on the electrode layers and containing a metal particle, carbon nanotubes, and a base resin. The conductive resin layer may have a carbon nanotube content of about 0.5 vol % to about 10 vol %.

The conductive resin layer may have a metal particle content of about 33 vol % to about 60 vol %.

The conductive resin layer may have a content of the base resin of about 38 vol % to about 65 vol %.

When diameters of the carbon nanotubes are defined as D, D may be in a range of about 1 nm to about 100 nm (1 nm≤D≤100 nm).

According to some embodiments of the present disclosure, a multilayer ceramic electronic component includes a ceramic body including dielectric layers and internal electrodes, electrode layers connected to the internal electrodes, and a conductive resin layer formed on the electrode layers and containing a metal particle, carbon nanotubes, and a base resin. The conductive resin layer may contain the base resin and the carbon nanotubes at a volume ratio of base resin/carbon nanotubes of about 100:1 to about 100:20.

The conductive resin layer may have a metal particle content of about 33 vol % to about 60 vol %.

The conductive resin layer may have a content of the base resin of about 38 vol % to about 65 vol %.

According to some embodiments of the present disclosure, a method of manufacturing a multilayer ceramic electronic component includes forming a ceramic body including dielectric layers and internal electrodes, forming electrode layers to be connected to the internal electrodes, applying a conductive paste containing a first conductor, carbon nanotubes, and a base resin to the electrode layers, and curing the conductive paste to form a conductive resin layer. The conductive resin layer may have a carbon nanotube content of about 0.5 vol % to about 10 vol %.

According to some embodiments of the present disclosure, a method of manufacturing a multilayer ceramic electronic component includes forming a ceramic body including dielectric layers and internal electrodes, forming electrode layers to be connected to the internal electrodes, applying a conductive paste containing a first conductor, carbon nanotubes, and a base resin to the electrode layers, and curing the conductive paste to form a conductive resin layer. The conductive resin layer may contain the base resin and the carbon nanotubes at a volume ratio of base resin:carbon nanotubes about 100:1 to about 100:20.

According to some embodiments of the present disclosure, a board having a multilayer ceramic electronic component mounted thereon includes a printed circuit board including first and second electrode pads formed on the printed circuit board, and a multilayer ceramic electronic component mounted on the printed circuit board. The multilayer ceramic electronic component may include a ceramic body including dielectric layers and internal electrodes, electrode layers connected to the internal electrodes, and a conductive resin layer formed on the electrode layers and containing a first conductor, a second conductor containing carbon nanotubes, and a base resin.

According to another embodiment of the present disclosure a multilayer ceramic electronic component is provided comprising a ceramic body including a plurality of alternating dielectric layers and internal electrodes. A pair of opposing electrode layers are connected to the internal electrodes. A conductive resin layer is disposed on each of the electrode layers. The conductive resin layer comprises metal particles, carbon nanotubes, and a base resin. The conductive resin layer comprises about 33 vol % to about 60 vol % of the metal particles, and about 38 vol % to about 65 vol % of the base resin.

In certain embodiments, the conductive resin layer may comprise about 0.5 vol % to about 10 vol % of the carbon nanotubes. The conductive resin layer may contain the base resin and the carbon nanotubes at a volume ratio of base resin:carbon nanotubes of about 100:1 to about 100:20.

In certain embodiments, the ratio of diameters (D) of the carbon nanotubes D and lengths (L) may satisfy the relationship $L/D \geq 1.0$, and the diameters (D) of the carbon nanotubes may satisfy the relationship $1 \text{ nm} \leq D \leq 100 \text{ nm}$.

BRIEF DESCRIPTION OF DRAWINGS

Embodiments of the present disclosure will be more clearly understood from the following description taken in conjunction with the accompanying drawings.

DETAILED DESCRIPTION

Figure 1:
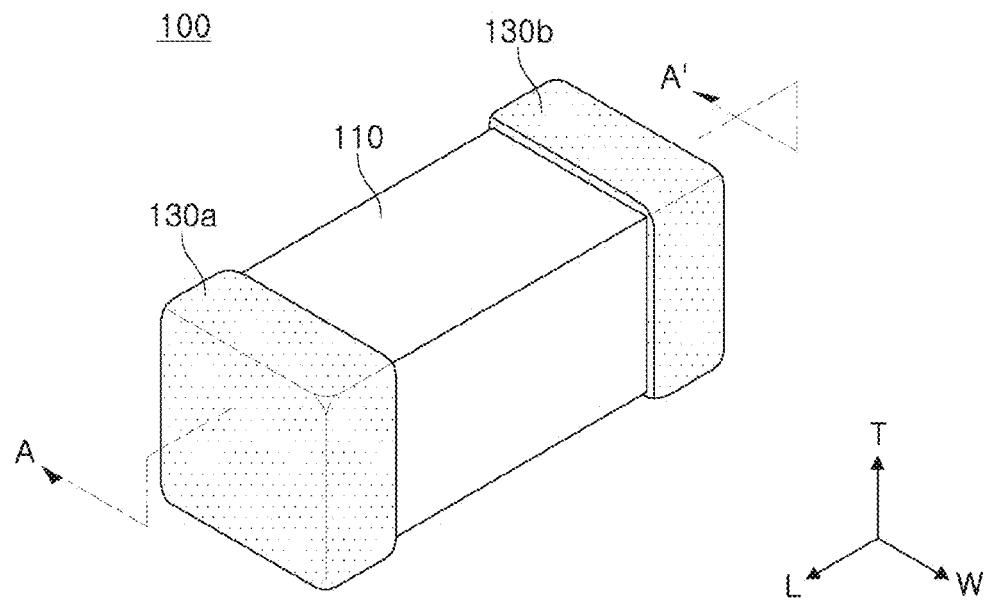
FIG. 1 is a perspective view of a multilayer ceramic electronic component according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided to explain the principles of the invention and its practical applications, thereby enabling others skilled in the art to understand the invention for various embodiments and with various modifications as are suited to the particular use contemplated.

In the drawings, the shapes and dimensions of elements may be exaggerated for clarity, and the same reference numerals will be used throughout to designate the same or like elements. It will also be understood that, although the terms first, second, etc. may be used herein to describe various elements, these elements should not be limited by these terms. These terms are only used to distinguish one element from another. As used in this description and the appended claims, the singular forms "a", "an" and "the" are intended to include the plural forms as well, unless the context clearly indicates otherwise.

Multilayer Ceramic Electronic Component 100

Figure 2:
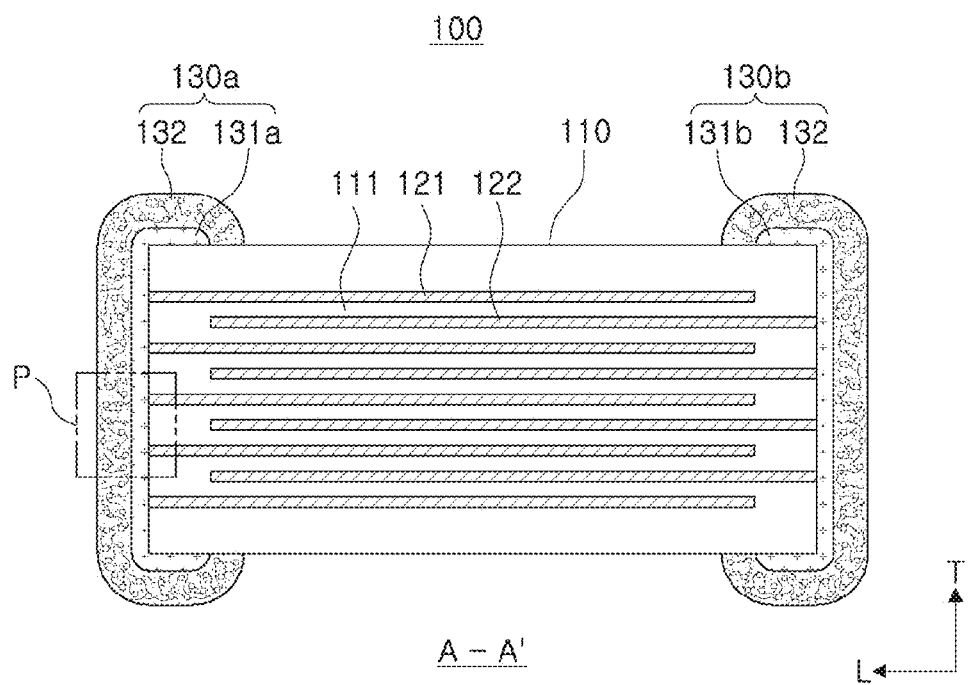
FIG. 2 is a cross-sectional view taken along line A-A' of FIG. 1.

FIG. 1 is a perspective view of the multilayer ceramic electronic component 100 according to an exemplary embodiment of the present disclosure, and FIG. 2 is a cross-sectional view taken along line A-A' of FIG. 1.

Figure 3:
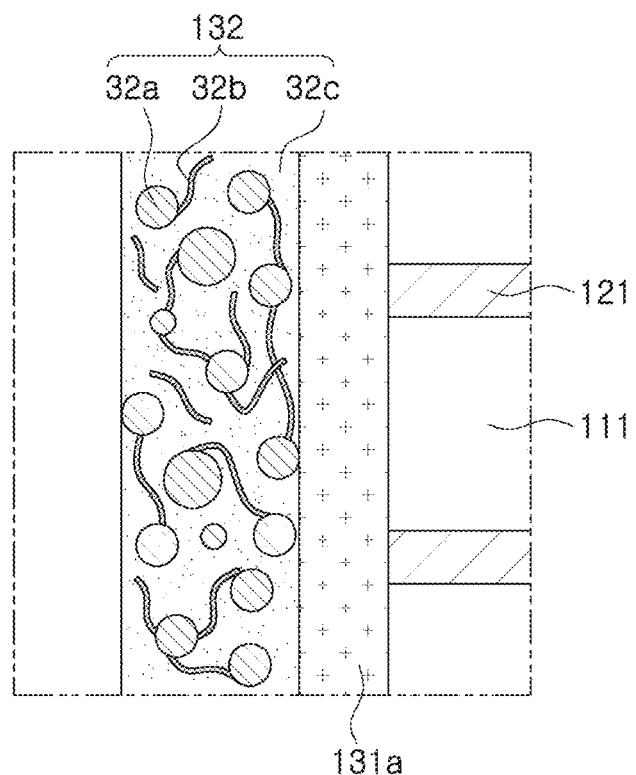
FIG. 3 is an enlarged view of part P of FIG. 2.

FIG. 3 is an enlarged view of part P of FIG. 2.

Referring to FIGS. 1 and 2, the multilayer ceramic electronic component 100 according to an exemplary embodiment of the present disclosure may include a ceramic body 110; and external electrodes 130a and 130b.

The ceramic body 110 may include an active layer as a portion contributing to forming capacitance of a capacitor, and upper and lower cover layers formed on upper and lower portions of the active layer, as upper and lower margin parts, respectively. The active layer may include dielectric layers 111 and internal electrodes 121 and 122.

In an exemplary embodiment of the present disclosure, a shape of the ceramic body 110 is not particularly limited, but may be a substantially hexahedral shape. Since a difference in a thickness may be generated due to sintering shrinkage of a ceramic powder at the time of sintering a chip and the presence or absence of an internal electrode pattern, and edge parts of the ceramic body may be polished, the ceramic body 110 may not have a perfect hexahedral shape and may have a shape substantially close to a hexahedral shape.

Directions of a hexahedron will be defined to clearly describe the exemplary embodiments of the present disclosure. L, W and T shown in the accompanying drawings refer to a length direction, a width direction, and a thickness direction, respectively. Here, the thickness direction may be the same as a direction in which the dielectric layers are stacked.

The internal electrode may be configured of first and second internal electrodes 121 and 122. The first and second internal electrodes 121 and 122 may be disposed to face each other, having the dielectric layer 111 therebetween. The first and second internal electrodes 121 and 122, a pair of electrodes having different polarities, may be formed by printing a conductive paste containing a conductive metal on the dielectric layer 111 to a predetermined thickness to be alternately exposed to both end surfaces of the ceramic body in the direction in which the dielectric layers 111 are stacked, and may be electrically insulated from each other by the dielectric layer 111 disposed therebetween.

For example, the first and second internal electrodes 121 and 122 may be electrically connected to the external electrodes 130a and 130b through portions of the internal electrodes alternately exposed to both end surfaces of the ceramic body 110. In further detail, the external electrode may include first and second external electrodes 130a and 130b, the first internal electrode may be electrically connected to the first external electrode 130a, and the second internal electrode may be electrically connected to the second external electrode 130b.

Therefore, when a voltage is applied to the first and second external electrodes 130a and 130b, electric charges are accumulated between the first and second internal electrodes 121 and 122 facing each other. In this case, capacitance of the multilayer ceramic electronic component 100 may be in proportion to an area of an overlapped region between the first and second internal electrodes 121 and 122.

A thickness of the first and second internal electrodes 121 and 122 may be determined according to the use thereof.

Further, the conductive metal contained in the first and second internal electrodes 121 and 122 may be nickel (Ni), copper (Cu), palladium (Pd), or an alloy thereof, but the present disclosure is not limited thereto.

In this case, a thickness of the dielectric layer 111 may be arbitrarily changed according to a capacitance design of the multilayer ceramic electronic component.

Further, the dielectric layer 111 may contain a ceramic powder having high permittivity, for example, a barium titanate ($BaTiO_3$)-based powder or a strontium titanate ($SrTiO_3$)-based powder, or the like, but the present disclosure is not limited thereto.

The upper and lower cover layers may have the same material and configuration as those of the dielectric layer 111 except that the upper and lower cover layers do not include internal electrodes. The upper and lower cover layers may be formed by stacking a single or two or more dielectric layers on upper and lower surfaces of the active layer in a vertical direction, respectively, and may generally serve to prevent the first and second internal electrodes 121 and 122 from being damaged by physical or chemical stress.

The first external electrode 130a may include a first electrode layer 131a and a conductive resin layer 132, and the second external electrode 130b may include a second electrode layer 131b and the conductive resin layer 132.

The first and second electrode layers 131a and 131b may be directly connected to the first and second internal electrodes to secure electrical connection between the external electrodes and the internal electrodes.

The first and second electrode layers 131a and 131b may contain a conductive metal. The conductive metal may be nickel (Ni), copper (Cu), palladium (Pd), gold (Au), or an alloy thereof, but the present disclosure is not limited thereto.

The first and second electrode layers 131a and 131b may be sintered-type electrodes formed by sintering a paste containing the conductive metal.

The conductive resin layer 132 may be disposed on the first and second electrode layers 131a and 131b.

In detail, the first and second electrode layers may be disposed on an outer surface of the ceramic body, and the conductive resin layer 132 may be disposed on outer portions of the first and second electrode layers.

In the present disclosure, a direction toward the center of the ceramic body 110 is referred to as an inner direction, and a direction outwards of the ceramic body 110 is referred to an outer direction, based on the external electrodes.

Figure 4A:
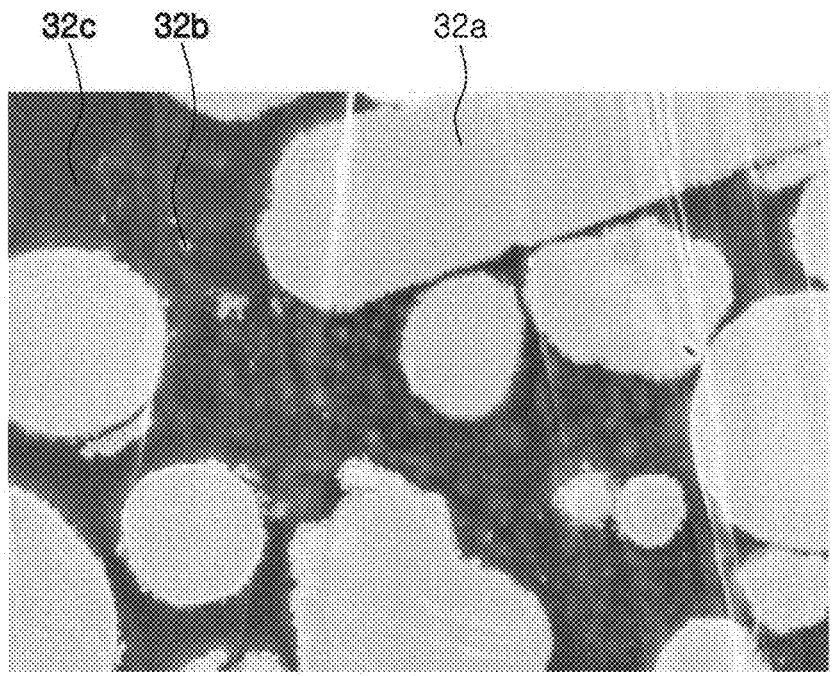
FIGS. 4A and 4B are scanning electron microscope (SEM) photographs showing a cross section of a conductive resin layer, one of components of the present disclosure.
Figure 4B:
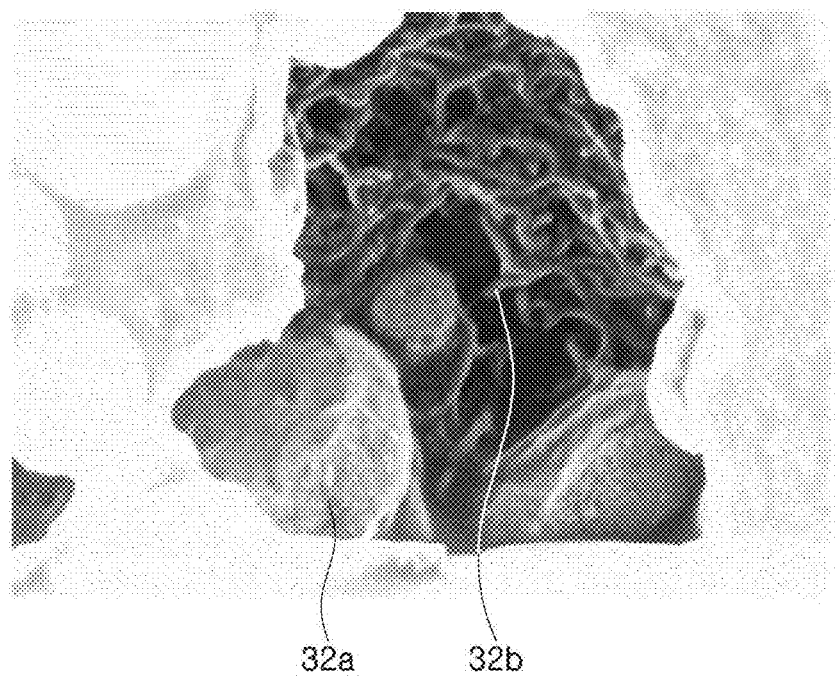

FIG. 3 is an enlarged view of part P of FIG. 2, and FIGS. 4A and 4B are scanning electron microscope (SEM) photographs showing a cross section of the conductive resin layer of the multilayer ceramic electronic component formed according to an exemplary embodiment of the present disclosure. As shown in FIGS. 3, 4A, and 4B, according to an exemplary embodiment of the present disclosure, the conductive resin layer 132 may contain a first conductor 32a, a second conductor 32b, and a base resin 32c.

The first conductor 32a may be a metal particle containing one or more of copper (Cu), silver (Ag), nickel (Ni), or alloys thereof, but is not limited thereto. In addition, the first conductor 32a may be spherical or flake-shaped.

The second conductor 32b may contain carbon nanotubes.

The conductive resin layer formed on the electrode layer may serve to prevent the plating solution from infiltrating into the multilayer ceramic electronic component at the time of forming a plating layer on a surface of the external electrode and increase flexural strength of the multilayer ceramic electronic component.

When a conductive resin layer contains a base resin, since the base resin may be decomposed or burned, it may be difficult to sinter a metal contained in the conductive resin layer at a relatively high temperature.

Therefore, in the case in which the conductive resin layer contains the base resin, since a current flow is generated through contact with a conductor contained therein and a tunneling effect, equivalent series resistance (ESR) may be relatively high as compared to a sintered-type electrode in which electron movements are relatively free.

However, according to an exemplary embodiment of the present disclosure, the conductive resin layer contains the carbon nanotubes, to provide the multilayer ceramic electronic component of which ESR is decreased as compared to a multilayer ceramic electronic component according to the related art.

For example, the carbon nanotubes may be attached to first conductor particles or disposed between the first conductors to serve to increase conductivity of the conductive resin layer.

Unlike the present disclosure, in the case in which the second conductor having a size smaller than that of the first conductor is made of a metal particle contained in the conductive resin layer in order to improve conductivity of the conductive resin layer, there is a limitation in a particle size of the second conductor due to an oxidation property of the metal particle, so as not to obtain a significant effect of improving electric conductivity of the conductive resin layer and decreasing ESR as compared to the conductive resin layer in which the second conductor is made of the carbon nanotubes according to the present disclosure.

In further detail, unlike the present disclosure, in the case in which the second conductor is formed of metal particles, a thin oxide film is formed on a surface of the second conductor through the oxidation of metal particles, and when the second conductor is formed to have a predetermined size or below, the second conductor may be entirely oxidized.

In other words, when the size of the second conductor formed of a metal is a predetermined size or less, even in the case of adding the second conductor, it may be difficult to significantly improve conductivity of the conductive resin layer due to oxidation of the second conductor. In the case of increasing the particle size in order to prevent oxidation of the second conductor, an effect of increasing contact points between the conductors may be decreased.

However, as in the present disclosure, when the second conductor is made of carbon nanotubes, because the second conductor having a relatively, significantly small size may be added, the contact points between the conductors may be significantly increased. In detail, because the carbon nanotubes may not be oxidized in the air atmosphere while having a significantly small diameter, an effect of decreasing ESR of the conductive resin layer may be relatively excellent as compared to the case of using fine metal particles as the second conductor.

Further, in the case in which the second conductor is configured of carbon nanotubes, a conductive channel may be formed by carbon nanotubes disposed between the first conductors, and thus, the tunneling effect may be increased, thereby decreasing ESR.

According to an exemplary embodiment of the present disclosure, the conductive resin layer 132 may contain the first conductor 32a, the carbon nanotubes 32b, and the base resin 32c, and may have a content of the first conductor of about 33 vol % to about 60 vol %, based on the total volume thereof.

In the case in which the first conductor is a metal particle, the conductive resin layer may have a metal particle content of about 33 vol % to about 60 vol %, based on the total volume thereof.

In the case in which the content of the first conductor is less than about 33 vol %, resistance of the conductive resin layer may increase due to an increase in an interval between the conductors, and in the case in which the content of the first conductor is more than about 60 vol %, adhesive force of the conductive resin layer to the electrode layer may decrease due to a decrease in a content of the base resin in the conductive resin layer.

According to an exemplary embodiment of the present disclosure, the conductive resin layer 132 may have a content of the base resin 32c of about 38 vol % to about 65 vol %. In the case in which the content of the base resin is less than about 38 vol %, the adhesive force of the conductive resin layer to the electrode layer may decrease, and in the case in which the content of the base resin is more than about 65 vol %, resistance of the conductive resin layer may increase, and at the time of forming the plating layer on the conductive resin layer, a non-plating phenomenon wherein the plating layer is not uniformly formed on the surface of the conductive resin layer may occur.

According to an exemplary embodiment of the present disclosure, the conductive resin layer 132 may have a content of carbon nanotubes 32b of about 0.5 vol % to about 10 vol %. In other words, a volume of the conductive resin layer occupied by the carbon nanotubes may be about 0.5 vol % to about 10 vol %.

In further detail, the conductive resin layer 132 may have a content of the carbon nanotubes 32b of about 0.55 vol % to about 9.88 vol %.

When the multilayer ceramic electronic component including the conductive resin layer 132 having a content of the carbon nanotubes 32b of about 0.55 vol % to about 9.88 vol % according to the exemplary embodiment of the present disclosure is heat-tested (thermally decomposed) by raising a temperature of the multilayer ceramic electronic component from room temperature to about 900° C. at a rate of about 10° C./min under a nitrogen and hydrogen atmosphere ($N_2$ of 99 wt % and $H_2$ of 1 wt %), a weight of the multilayer ceramic electronic component may decrease by about 0.33 wt % to about 2.19 wt %.

In the case in which the content of the carbon nanotubes contained in the conductive resin layer is less than about 0.5 vol %, the effect of decreasing ESR is not significantly exhibited. In the case in which the content of the carbon nanotubes is more than about 10 vol %, a fraction of the carbon nanotube fine particles increases, thereby reducing adhesive force between the electrode layer and the conductive resin layer due to a decrease in an area of the base resin contacting the electrode layer at an interface between the electrode layer and the conductive resin layer.

According to an exemplary embodiment of the present disclosure, the conductive resin layer 132 may contain the base resin 32c and the carbon nanotubes 32b at a volume ratio of about 100:1 to about 100:20. In other words, the volume ratio of the base resin and the carbon nanotubes contained in the conductive resin layer may be about 100:1 to about 100:20 (base resin:carbon nanotube). In detail, a volume ratio of the carbon nanotubes to the base resin contained in the conductive resin layer may be about 1/100 to about 1/5.

In the case in which a weight decrease rate is defined as A when the multilayer ceramic electronic component in which the conductive resin layer 132 contains the base resin 32c and the carbon nanotubes 32b at the volume ratio of about 100:1 to about 100:20 of base resin:carbon nanotubes is heat-tested (thermally decomposed) by raising a temperature of the multilayer ceramic electronic component from a room temperature to about 900° C. at a rate of about 10° C./min under a nitrogen and hydrogen atmosphere ($N_2$ of 99 wt % and $H_2$ of 1 wt %), and a weight decrease rate is defined as B when a comparative electronic part containing the first conductor and the base resin at the same ratio as that in the multilayer ceramic electronic component according to this exemplary embodiment but not containing the second conductor is heat-tested (thermally decomposed) by raising a temperature from room temperature to about 900° C. at a rate of about 10° C./min under a nitrogen and hydrogen atmosphere ($N_2$ of 99 wt % and $H_2$ of 1 wt %), A/B may be about 1.43 to about 9.52.

In the case in which the volume ratio of the base resin and the carbon nanotubes contained in the conductive resin layer is less than about 100:1, in other words, in the case in which the volume ratio of the carbon nanotubes to the base resin is less than about 1/100, the effect of increasing the conductive channel may not be high, such that an effect of decreasing ESR may be negligible.

In the case in which the volume ratio of the base resin and the carbon nanotubes contained in the conductive resin layer is more than about 100:20, in other words, in the case in which the volume ratio of the carbon nanotubes to the base resin is more than about 1/5, as a particle fraction of the carbon nanotubes having a relatively small size increases, the fraction of the base resin enclosing the carbon nanotubes may increase, and an area of the base resin contacting the electrode layer may decrease. Thus, adhesive force at an interface between the electrode layer and the conductive resin layer may decrease, thereby causing a delamination defect between the electrode layer and the conductive resin layer or a tape test defect.

The tape test defect indicates the conductive resin layer is separating from the electrode layer when a tape having a predetermined level or more of adhesive force is attached to the conductive resin layer and is then detached from the conductive resin layer.

Figure 5:
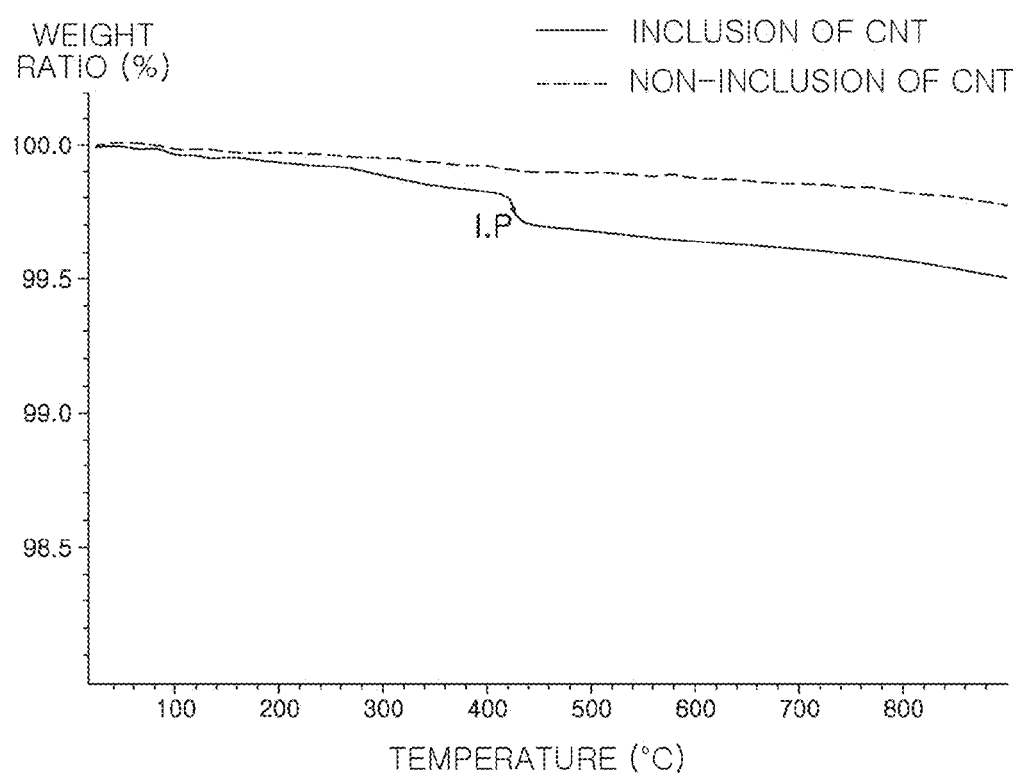
FIG. 5 is a graph illustrating heat-test (thermal decomposition) results of the multilayer ceramic electronic component according to an Example and a multilayer ceramic electronic component according to Comparative Example.

FIG. 5 is a graph illustrating heat-test (thermal decomposition) results of a multilayer ceramic electronic component according to an Example and a multilayer ceramic electronic component according to a Comparative Example.

In the thermal decomposition illustrated in FIG. 5, in the multilayer ceramic electronic component according to an exemplary embodiment of the present disclosure (hereinafter, referred to as the Example and represented by 'INCLUSION OF CNT' in FIG. 5), the conductive resin layer contains copper particles as the first conductor, the base resin, and the carbon nanotubes at a volume ratio of about 44.5:54.0:1.485 (copper particle:base resin:carbon nanotube), and in the multilayer ceramic electronic component according to the Comparative Example (hereinafter represented by 'NON-INCLUSION OF CNT' in FIG. 5), other components are the same as those in the multilayer ceramic electronic component according to an exemplary embodiment of the present disclosure, but the conductive resin layer does not contain the carbon nanotubes, but rather, contains the copper particles as the first conductor and the base resin at a volume ratio of about 44.5:54.0 (copper particles:base resin).

The heat-test (thermal decomposition) was performed on the multilayer ceramic electronic components in the Example and the Comparative Example by raising a temperature of the multilayer ceramic electronic components from room temperature to about 900° C. at a rate of about 10° C./min under a nitrogen and hydrogen atmosphere ($N_2$ of 99 wt % and $H_2$ of 1 wt %).

As shown in FIG. 5, it may be appreciated that after the heat-test (thermal decomposition), a weight of the multilayer ceramic electronic component in the Example decreased by about 0.5 wt %, and a weight of the multilayer ceramic electronic component in the Comparative Example decreased by about 0.23 wt %.

In addition, as illustrated in FIG. 5, it may be appreciated that a heat-test (thermal decomposition) behavior graph of the multilayer ceramic electronic component in the Example has an inflection point (I.P), and the inflection point is shown at about 400° C.

As in an exemplary embodiment of the present disclosure, when the conductive resin layer contains the base resin and the carbon nanotubes at the volume ratio of about 100:1 to about 100:20, the inflection point may be present in a section from about 300° C. to about 500° C. in the heat-test (thermal decomposition) behavior graph of the multilayer ceramic electronic component.

Figure 6A:
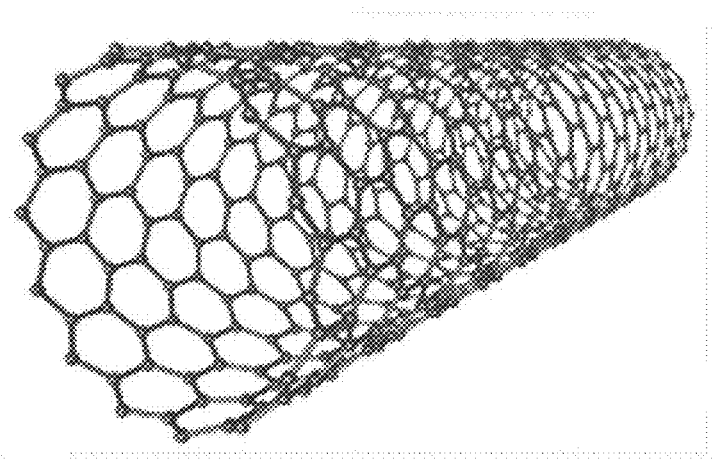
FIG. 6A is a diagram illustrating a structure of carbon nanotubes, one of components of the present disclosure.
Figure 6B:
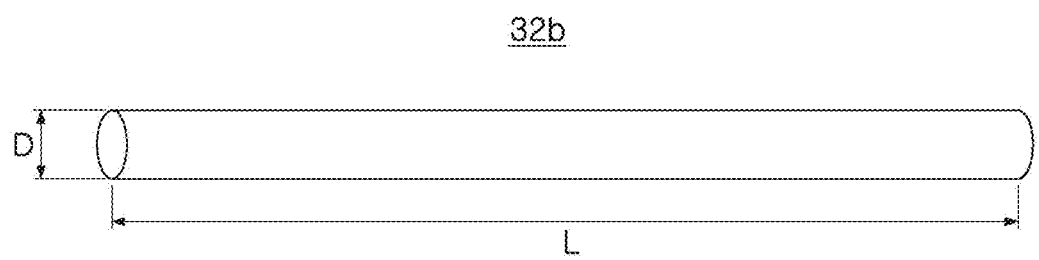
FIG. 6B is a schematic view of the carbon nanotube, one of components of the present disclosure.

FIG. 6A is a diagram illustrating the structure of carbon nanotube, one of components of the present disclosure, and FIG. 6B is a schematic view of carbon nanotube, one of components of the present disclosure.

As shown in FIG. 6A, the carbon nanotube, a component of the multilayer ceramic electronic component according to the present disclosure, may indicate a conductor in which hexagonal shapes composed of 6 carbons are connected to each other to have a tube shape.

The carbon nanotubes $32b$ may have flexibility, and FIG. 6B schematically shows a state in which the carbon nanotube is disposed to be linear. The carbon nanotubes may not necessarily be disposed in the conductive resin layer as shown in FIG. 3, and may be freely disposed to have a linear or curved form.

In further detail, the carbon nanotubes $32b$ may include at least one of a single-walled carbon nanotube and a multi-walled carbon nanotube.

The base resin $32c$ may be a thermosetting resin and include an epoxy resin, but is not limited thereto.

The conductive resin layer may be formed on the electrode layer and serve to prevent infiltration of the plating solution into the electrode layer and the ceramic body and may absorb physical impacts applied from the outside to protect the multilayer ceramic electronic component.

However, since the conductive resin layer contains the base resin, the conductive resin layer may have relatively low electric conductivity as compared to the electrode layer, a sintered-type electrode.

In further detail, in the conductive resin layer, since a current flow is generated by contacts between the conductors distributed in the base resin or the tunneling effect, as the content of the resin is increased, ESR may be increased.

In the case of decreasing the content of the base resin contained in the conductive resin layer and increasing the content of the conductor, an ESR value may be slightly decreased, but a function of absorbing external impacts and preventing infiltration of the plating solution may be decreased.

However, according to the present disclosure, since the conductive resin layer contains the carbon nanotubes, even in the case of containing a predetermined amount of the base resin for absorbing external impacts and preventing infiltration of the plating solution, a relatively low ESR value may be implemented.

In further detail, the carbon nanotubes may be distributed between the first conductors to increase the contact between the first conductors and thus increase a path through which current flows, thereby significantly decreasing ESR.

In detail, according to an exemplary embodiment of the present disclosure, when the carbon nanotubes having a nano size is contained in the conductive resin, an occupancy rate of particles in the conductive resin layer may be improved according to a bimodal system theory.

Further, since the carbon nanotubes have flexibility, contacts between the first conductors may be further facilitated.

Referring to FIG. 6B, when diameters of the carbon nanotubes $32b$ are defined as D and a length thereof is defined as L, the diameters D of the carbon nanotubes may be in a range of about 1 nm to about 100 nm (1 nm≤D≤100 nm).

When the diameters D of the carbon nanotubes are less than about 1 nm, at the time of manufacturing the conductive resin layer, the carbon nanotubes contained in a conductive resin paste may be broken during a dispersion process, and lose their conductive effect. Further, when the diameter D is more than about 100 nm, because a coarse linear solid content is increased, a filling rate of the conductive resin paste may decrease, thus causing deterioration in reliability of the multilayer ceramic electronic component.

According to an exemplary embodiment of the present disclosure, L/D may be about 1.0 or more (L/D≥1.0). In the case in which L/D is less than 1.0, a role of the carbon nanotubes forming a current path between the first conductor particles may be insignificant, such that the effect of decreasing ESR may be insignificant.

In further detail, according to an exemplary embodiment of the present disclosure, L/D may be about 2 or more (L/D≥2.0).

Since the carbon nanotube, a conductor having a form of fiber having a nano level of diameter, has a significantly small volume as compared to a length thereof, even in the case of adding the carbon nanotubes at a relatively small volume ratio, the carbon nanotubes may increase the current path (a conductive channel) between the first conductor particles, thereby decreasing ESR.

Further, even when the carbon nanotubes do not directly contact the first conductor, the carbon nanotubes may be disposed between the first conductors to increase a path through which electrons move due to the tunneling effect, thereby efficiently decreasing ESR.

In addition, since the carbon nanotubes have flexibility, the carbon nanotubes may be efficiently disposed between the first conductors having a spherical or flake shape.

A plating layer (not shown) may be formed on the conductive resin layer. The plating layer may include a nickel plating layer and a tin plating layer. The nickel plating layer may be disposed on the conductive resin layer, and the tin plating layer may be disposed on the nickel plating layer.

However, even when the plating layer is formed on the conductive resin layer, the above-mentioned heat-test (thermal decomposition) behavior needs to be evaluated after removing the plating layer by polishing, etching, or the like.

The conductive resin layer according to the present disclosure contains the first conductor and the carbon nanotubes, to provide the multilayer ceramic electronic component having relatively low ESR while maintaining an impact absorption property and a plating solution infiltration prevention property.

Method of Manufacturing Multilayer Ceramic Electronic Component

Figure 7:
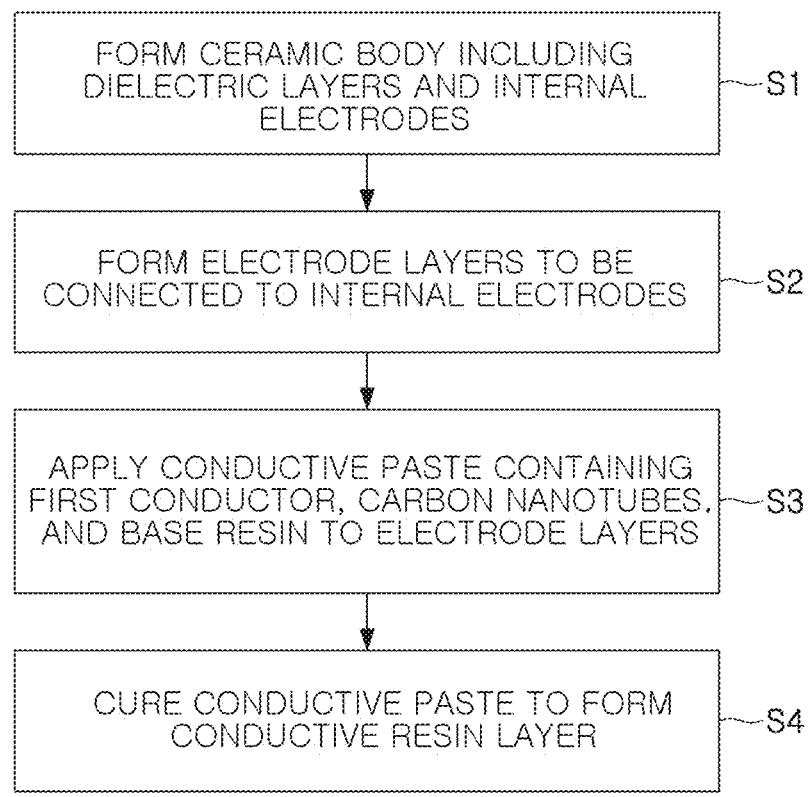
FIG. 7 is a flow chart illustrating a method of manufacturing a multilayer ceramic electronic component according to another exemplary embodiment of the present disclosure.

FIG. 7 is a flow chart illustrating a method of manufacturing a multilayer ceramic capacitor according to another exemplary embodiment of the present disclosure.

Referring to FIG. 7, the method of manufacturing a multilayer ceramic capacitor according to the exemplary embodiment of the present disclosure may include forming a ceramic body including dielectric layers and internal electrodes (S1), forming electrode layers to be connected to the internal electrodes (S2), applying a conductive paste containing a first conductor, carbon nanotubes, and a base resin to the electrode layer (S3), and curing the conductive paste to form a conductive resin layer (S4).

Among descriptions of the manufacturing method of a multilayer ceramic capacitor according to the exemplary embodiment of the present disclosure, a description overlapped with that of the multilayer ceramic electronic component described in the foregoing embodiment of the present disclosure will be omitted.

In the method of manufacturing a multilayer ceramic electronic component according to an exemplary embodiment of the present disclosure, first, a slurry containing powder such as barium titanate ($BaTiO_3$) powder, or the like, may be applied to and dried on a carrier film to prepare a plurality of ceramic green sheets, thereby forming the dielectric layer and a cover layer.

The ceramic green sheet may be manufactured by mixing ceramic powder, a binder, and a solvent to prepare a slurry and manufacturing the prepared slurry as a sheet having a designed thickness by a doctor blade method.

Next, a conductive paste for an internal electrode containing a metal powder may be prepared.

After the conductive paste for an internal electrode is applied to the green sheet by a screen printing method to form the internal electrode, a plurality of green sheets on which the internal electrode is printed may be stacked, and a plurality of green sheets on which the internal electrode is not printed may be stacked on upper and lower surfaces of the multilayer body, followed by sintering, thereby manufacturing a ceramic body 110. The ceramic body may include internal electrodes 121 and 122, the dielectric layers 111, and the cover layer. The dielectric layer is formed by sintering the green sheet on which the internal electrode is printed, and the cover layer is formed by sintering the green sheet on which the internal electrode is not printed.

The internal electrodes may include the first and second internal electrodes 121 and 122.

The electrode layers may be formed to be electrically connected to the internal electrode.

In further detail, the first and second electrode layers 131a and 131b may be formed on an outer surface of the ceramic body so as to be electrically connected to the first and second internal electrodes 121 and 122, respectively. The first and second electrode layers may be formed by sintering a paste containing a conductive metal and glass.

The conductive metal is not particularly limited, but may be, for example, one or more selected from a group consisting of copper (Cu), silver (Ag), nickel (Ni), and alloys thereof. In further detail, the conductive metal may contain copper (Cu).

The glass is not particularly limited, but may be a material having the same composition as that of glass used in forming an external electrode of a general multilayer ceramic capacitor.

The conductive paste containing the first conductor, the carbon nanotubes, and the base resin may be applied to outer portions of the first and second electrode layers. The first conductor may be spherical or flake-shaped and may include at least one or more of copper, silver, nickel, or an alloy thereof, but is not limited thereto.

The base resin may be an epoxy resin, a thermosetting resin.

The conductive resin layer may be formed by heat-curing the conductive paste.

Further, a plating layer may be formed on the conductive resin layer.

A description related to the manufacturing method of a multilayer ceramic electronic component overlapped with those of the multilayer ceramic electronic component described in the foregoing exemplary embodiment of the present disclosure will be omitted to avoid an overlapped description.

Board Having Multilayer Ceramic Electronic Component Mounted Thereon

Figure 8:
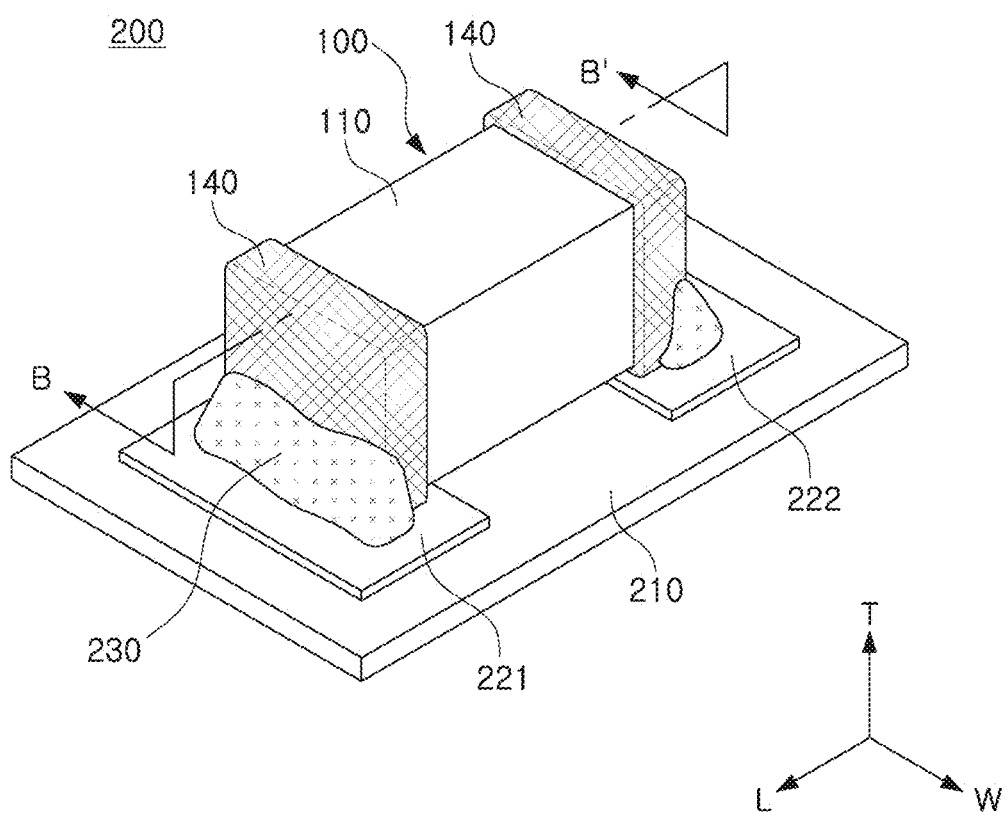
FIG. 8 is a schematic perspective view of a mounting board having a multilayer ceramic electronic component mounted thereon according to another embodiment of the present disclosure.
Figure 9:
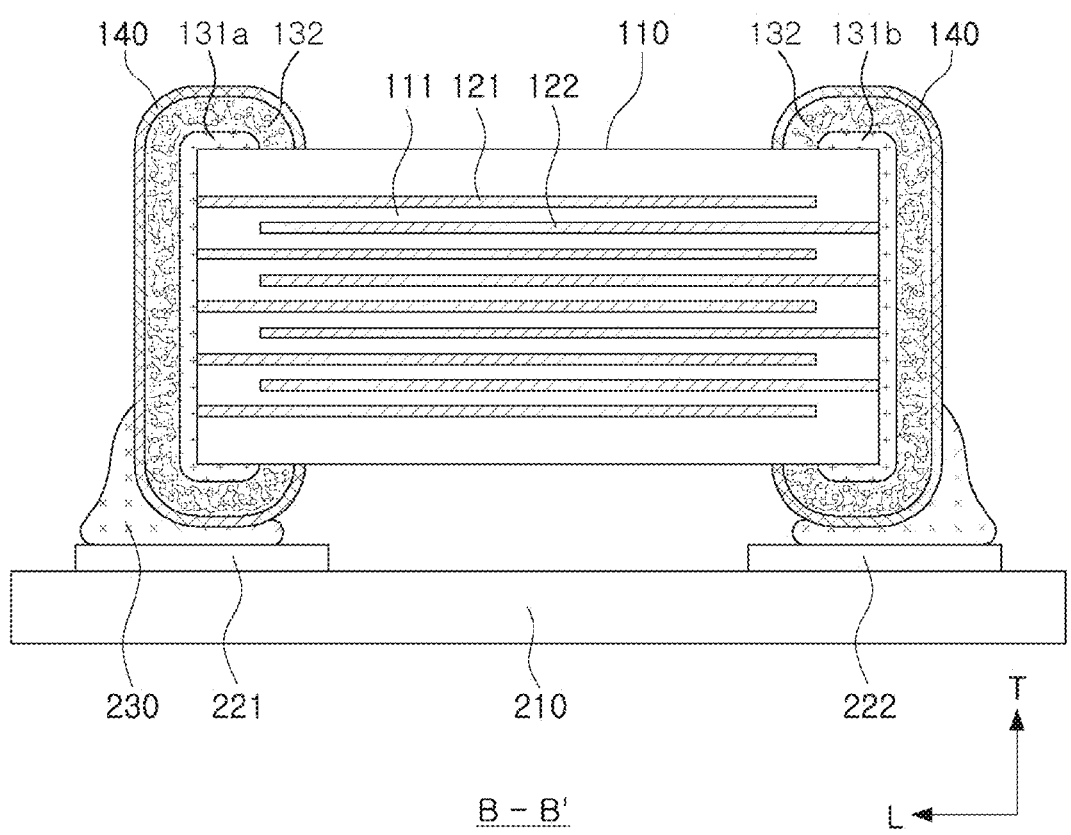
FIG. 9 is a cross-sectional view taken along line B-B' of FIG. 8.

FIG. 8 is a schematic perspective view of a board having a multilayer ceramic electronic component mounted thereon according to another exemplary embodiment of the present disclosure, and FIG. 9 is a cross-sectional view taken along line B-B' of FIG. 8.

Referring to FIGS. 8 and 9, the board 200 having a multilayer ceramic electronic component mounted thereon according to this exemplary embodiment may include a printed circuit board 210 having first and second electrode pads 221 and 222 formed thereon; and a multilayer ceramic electronic component 100 mounted on the printed circuit board. The multilayer ceramic electronic component includes a ceramic body 110 including dielectric layers 111 and internal electrodes 121 and 122, electrode layers 130a and 130b connected to the internal electrodes, and a conductive resin layer 132 formed on the electrode layer and containing a first conductor, a second conductor containing carbon nanotubes, and a base resin. When the multilayer ceramic electronic component is heat-test by raising a temperature of the multilayer ceramic electronic component from a room temperature to about 900° C. at a rate of about 10° C./min, a weight of the multilayer ceramic electronic component may decrease by about 0.33% to about 2.19%.

The multilayer ceramic electronic component according to the exemplary embodiment of the present disclosure may further include a plating layer 140 formed on a surface of an external electrode of the multilayer ceramic electronic component. The plating layer may improve adhesive force with a solder at the time of mounting the multilayer ceramic electronic component on the printed circuit board to thereby improve a mounting property of the multilayer ceramic electronic component.

The plating layer 140 may be formed on the conductive resin layer 132, and heat-test (thermal decomposition) of the multilayer ceramic electronic component may be performed after removing the plating layer using a polishing method, an etching method, or the like.

A description of contents related to the board having a multilayer ceramic electronic component mounted thereon overlapped with those of the multilayer ceramic electronic component described in the foregoing exemplary embodiment of the present disclosure will be omitted to avoid an overlapped description.

Experimental Example

Data in Table 1 indicate results obtained by evaluating ESR and adhesion defect rates according to volume-based contents of carbon nanotubes contained in a conductive resin layer of a multilayer ceramic electronic component, and heat-test results.

First, a slurry containing a powder such as a barium titanate ($BaTiO_3$) powder, or the like, was applied to and dried on a carrier film to prepare a plurality of ceramic green sheets, thereby forming dielectric layers.

Next, a conductive paste for an internal electrode containing nickel powder particles was prepared. The conductive paste for an internal electrode was applied to the green sheet by a screen printing method to thereby form an internal electrode. Then, 100 or more green sheets were stacked to thereby form a plurality of multilayer bodies.

Thereafter, the multilayer body was compressed, cut, and sintered, to allow the internal electrodes to be alternately exposed to end surfaces of a ceramic body opposing each other, thereby forming a hexahedral shaped ceramic body having a size of about 1.6 mm×0.8 mm×0.8 mm (length× width×thickness). Then, the ceramic body was polished, and sintered-type electrode layers were formed on end surfaces of the ceramic body to be connected to the internal electrodes.

The sintered-type electrode layer was formed by sintering a paste containing a copper powder and glass.

Next, a conductive resin layer containing a copper powder as a first conductor, an epoxy resin as a base resin, and carbon nanotubes was formed on the electrode layer to have a content (based on a volume) shown in Table 1, and a plating layer was formed on the conductive resin layer. Then, the ERS and adhesion defect rate according to a volume ratio of the carbon nanotubes in the conductive resin layer were evaluated.

In the Experimental Example of Table 1, copper particles having a size of about 1 μm to about 2 μm were used as the first conductor, and the epoxy resin was used as the base resin. Here, the conductive resin layer was formed to have a thickness of about 30 μm.

In the Experimental Example of Table 1, the conductive resin layer contained the first conductor and the base resin at a volume ratio of the conductor:base resin of about 44.5:54.0.

The ESR was evaluated using an ESR measuring device, and an adhesion defect rate was evaluated by observing a rate of the conductive resin layer separated from the electrode layer when a tape was detached from the conductive resin layer after a tape having adhesive force of about 1600 gf was attached to the conductive resin layer. In further detail, when the tape was detached from the conductive resin layer after the tape having adhesive force of about 1600 gf was attached to the conductive resin layer, when the conductive resin layer was separated from the electrode layer, the multilayer ceramic electronic component was evaluated as a defective product. When the conductive resin layer was not separated from the electrode layer, the multilayer ceramic electronic component was evaluated as a good product.

The heat-test (thermal decomposition) results were measured as shown in FIG. 1 by raising a temperature of the multilayer ceramic electronic component from room temperature to about 900° C. at a rate of about 10° C./min under a nitrogen and hydrogen atmosphere (99 wt % of $N_2$ and 1 wt % of $H_2$) and then measuring a weight decrease rate of the multilayer ceramic electronic components. However, in order to increase accuracy of the heat-test (thermal decomposition) results, in the case in which the plating layer was formed on the conductive resin layer, the weight decrease rate was measured based on the multilayer ceramic electronic component from which the plating layer was removed.

TABLE 1

| Sample | Volume Ratio (%) of Carbon nanotubes in Conductive Resin Layer | ESR (mΩ) | Adhesion Defect Rate (%) | Weight Decrease Rate (%) After Heat-Test |
|---|---|---|---|---|
| 1 | 0 | 47.5 | 0 | 0.23 |
| 2 | 0.27 | 46.9 | 0 | 0.28 |
| 3 | 0.44 | 46.2 | 0 | 0.31 |
| 4 | 0.55 | 38.5 | 0 | 0.33 |
| 5 | 1.62 | 32.8 | 0 | 0.52 |
| 6 | 2.67 | 29.1 | 0 | 0.72 |
| 7 | 5.20 | 24.0 | 0 | 1.21 |
| 8 | 7.60 | 18.2 | 0 | 1.7 |
| 9 | 8.98 | 14.18 | 0 | 2 |
| 10 | 9.43 | 12.84 | 0 | 2.1 |
| 11 | 9.88 | 11.5 | 0.6 | 2.19 |
| 12 | 10.32 | 1016 | 8 | 2.29 |

Referring to Table 1, it may be appreciated that when the volume ratio of the carbon nanotubes contained in the conductive resin layer was less than about 0.5%, an effect of decreasing ESR was insignificant, but when the volume ratio was about 0.5% or more, ESR was significantly decreased.

In addition, it may be appreciated that in the case in which the volume ratio of the carbon nanotubes contained in the conductive resin layer was more than about 10%, the adhesion defect rate was relatively high due to a decrease in adhesive force of the conductive resin layer to the electrode layer.

Therefore, it may be appreciated that the carbon nanotubes contained in the conductive resin layer may have a content of about 0.5 vol % to about 10 vol %.

In detail, the conductive resin layer may have a carbon nanotube content of 0.55 to 9.88 vol %. In further detail, the conductive resin layer may have a carbon nanotube content of about 0.55 vol % to about 9.43 vol %.

In detail, a content of the carbon nanotubes contained in the conductive resin layer may be about 0.55 vol % to about 9.88 vol %. In further detail, a content of the carbon nanotubes contained in the conductive resin layer may be about 0.55 vol % to about 9.43 vol %.

Data shown in Table 2 indicate results obtained by evaluating ESR and an adhesion defect rate of the conductive resin layer according to volume ratios of a base resin and carbon nanotubes contained in a conductive resin layer of a multilayer ceramic electronic component, and heat-test (thermal decomposition) results.

The multilayer ceramic electronic component in the Experimental Example of Table 2 was formed by the same method as that in the multilayer ceramic electronic component used in the Experimental Example of Table 1. In the Experimental Example of Table 2, the conductive resin layer contained a first conductor and the base resin at a volume ratio of first conductor:base resin of about 44.5:54.0.

The ESR and the adhesion defect rate of the following Table 2 were measured by the same method as that in the Experimental Example of Table 1.

The thermal decomposition results of Table 2 were indicated as weight decrease rates of other samples 14 to 24 after a heat test with respect to a weight decrease rate of a sample 13 after a heat-test, based on sample 13 of the Experimental Example in which the carbon nanotubes were not added.

In other words, when the weight decrease rate of the sample 13 after the heat test was defined as A' and the weight decrease rate of one of the other samples 14 to 24 after the heat-test was defined as B', B'/A' was evaluated.

TABLE 2

| Sample | Base Resin:Carbon Nanotube | ESR (mΩ) | Adhesion Defect Rate (%) | Thermal Decomposition Result (B'/A') |
|---|---|---|---|---|
| 13 | 100:0 | 47.5 | 0 | 1.00 |
| 14 | 100:0.5 | 46.9 | 0 | 1.22 |
| 15 | 100:0.8 | 46.2 | 0 | 1.35 |
| 16 | 100:1 | 38.5 | 0 | 1.43 |
| 17 | 100:3 | 32.8 | 0 | 2.26 |
| 18 | 100:5 | 29.1 | 0 | 3.13 |
| 19 | 100:10 | 24.0 | 0 | 5.26 |
| 20 | 100:15 | 18.2 | 0 | 7.39 |
| 21 | 100:18 | 14.18 | 0 | 8.70 |
| 22 | 100:19 | 12.84 | 0 | 9.13 |
| 23 | 100:20 | 11.5 | 0.8 | 9.52 |
| 24 | 100:21 | 10.16 | 6 | 9.96 |

Referring to Table 2, it may be appreciated that in the case in which the volume ratio of the base resin and the carbon nanotubes in the conductive resin layer is less than about 100:1, an effect of decreasing ESR is insignificant, while when the volume ratio was about 100:1 or more, ESR is significantly decreased.

In addition, it could be appreciated that in the case in which the volume ratio of the base resin and the carbon nanotubes in the conductive resin layer was more than about 100:20, the adhesion defect rate was relatively high due to a decrease in adhesive force of the conductive resin layer to the electrode layer.

Therefore, it may be appreciated that a volume ratio of the base resin and the carbon nanotubes in the conductive resin layer was about 100:1 to about 100:20.

The following Table 3 shows a change in ESR according to a change in a ratio (L/D) of length of a second conductor contained in a conductive resin layer of a multilayer ceramic capacitor to a diameter of the second conductor. In Experimental Example of Table 3, multilayer ceramic electronic components were formed to have the same size as that in Experimental Example of Table 1 using the same material and method as those in Experimental Example of Table 1 so that a volume ratio of a first conductor, a base resin and carbon nanotubes contained in the conductive resin layer was about 43.97:50.83:5.20 (first conductor:base resin:carbon nanotubes).

TABLE 3

| Sample | L/D | ESR (mΩ) |
|---|---|---|
| 25 | 0.8 | 75.3 |
| 26 | 0.9 | 71.1 |
| 27 | 1 | 49.7 |
| 28 | 1.1 | 42.8 |
| 29 | 2 | 16.7 |
| 30 | 5 | 17.2 |

As shown in Table 3, it may be appreciated that in the case in which L/D is less than about 1, ESR is 70 mΩ or more, while in the case in which L/D is about 1 or more, ESR is significantly decreased to be less than 50 mΩ.

Further, in the case in which L/D is about 2 or more, ESR tends to be significantly decreased again.

As set forth above, according to some exemplary embodiments of the present disclosure, a multilayer ceramic electronic component having impacts absorption and plating solution infiltration prevention properties and low ESR, a manufacturing method thereof, and a board having the same mounted thereon may be provided.

While exemplary embodiments have been shown and described above, it will be apparent to those skilled in the art that modifications and variations could be made without departing from the spirit and scope of the present disclosure as defined by the appended claims. Accordingly, the illustrative discussions above are not intended to be exhaustive or to limit the invention to the precise forms disclosed.

What is claimed is:

1. A multilayer ceramic electronic component comprising:
   a ceramic body including dielectric layers and internal electrodes;
   electrode layers connected to the internal electrodes; and
   a conductive resin layer disposed on the electrode layers and including first conductor, a second conductor containing carbon nanotubes, and a base resin,
   wherein the conductive resin layer has a content of the first conductor of about 33 vol % to about 60 vol %.

2. The multilayer ceramic electronic component of claim 1, wherein the conductive resin layer has a carbon nanotube content of about 0.5 vol % to about 10 vol %.

3. The multilayer ceramic electronic component of claim 1, wherein the conductive resin layer contains the base resin and the carbon nanotubes at a volume ratio of base resin:carbon nanotubes of about 100:1 to about 100:20.

4. The multilayer ceramic electronic component of claim 1, wherein when diameters of the carbon nanotubes are defined as D, D is in a range of about 1 nm to about 100 nm.

5. The multilayer ceramic electronic component of claim 1, wherein the first conductor is spherical or flake-shaped.

6. The multilayer ceramic electronic component of claim 1, wherein when the multilayer ceramic electronic component is heat-tested by raising a temperature of the multilayer ceramic electronic component from room temperature to about 900° C. at a rate of about 10° C./min, a weight of the multilayer ceramic electronic component decreases by about 0.33% to about 2.19%.

7. The multilayer ceramic electronic component of claim 6, wherein when a weight decrease rate at the time of performing a heat-test of the multilayer ceramic electronic component by the raising the temperature of the multilayer ceramic electronic component from room temperature to about 900° C. at the rate of about 10° C./min is defined as A and a weight decrease rate at the time of performing a heat-test of a comparative electronic part containing a first conductor and a base resin at the same ratio as those in the multilayer ceramic electronic component but not containing a second conductor by raising a temperature thereof from room temperature to about 900° C. at the rate of about 10° C./min is defined as B, A/B is about 1.43 to about 9.52.

8. The multilayer ceramic electronic component of claim 6, wherein a temperature-weight graph illustrating the heat-testing step of the multilayer ceramic electronic component has an inflection point, and the inflection point is present in a temperature range of about 300° C. to about 500° C.

9. A multilayer ceramic electronic component comprising:
a ceramic body including dielectric layers and internal electrodes;
electrode layers connected to the internal electrodes; and
a conductive resin layer formed on the electrode layers and containing a metal particle, carbon nanotubes, and a base resin,
wherein the conductive resin layer has a carbon nanotube content of about 0.5 vol % to about 10 vol %, and
wherein when diameters of the carbon nanotubes are defined as D, D is in a range of about 1 nm to about 100 nm.

10. The multilayer ceramic electronic component of claim 9, wherein the conductive resin layer has a metal particle content of about 33 vol % to about 60 vol %.

11. The multilayer ceramic electronic component of claim 9, wherein the conductive resin layer has a content of the base resin of about 38 vol % to about 65 vol %.

12. A multilayer ceramic electronic component comprising:
a ceramic body including dielectric layers and internal electrodes;
electrode layers connected to the internal electrodes; and
a conductive resin layer formed on the electrode layers and containing a metal particle, carbon nanotubes, and a base resin,
wherein the conductive resin layer contains the base resin and the carbon nanotubes at a volume ratio of base resin:carbon nanotubes of about 100:1 to about 100:20, and
wherein the conductive resin layer has a content of the base resin of about 38 vol % to about 65 vol %.

13. The multilayer ceramic electronic component of claim 12, wherein the conductive resin layer has a metal particle content of about 33 vol % to about 60 vol %.

14. A board having a multilayer ceramic electronic component mounted thereon, the board comprising:
a printed circuit board including first and second electrode pads formed on the printed circuit board; and
the multilayer ceramic electronic component of claim 12 mounted on the printed circuit board.

15. A method of manufacturing a multilayer ceramic electronic component, the method comprising:
forming a ceramic body including dielectric layers and internal electrodes;
forming electrode layers to be connected to the internal electrodes;
applying a conductive paste containing a first conductor, carbon nanotubes, and a base resin to the electrode layers; and
curing the conductive paste to form a conductive resin layer,
wherein the conductive resin layer has a content of the first conductor of about 33 vol % to about 60 vol %.

16. The method of manufacturing a multilayer ceramic electronic component according to claim 15, wherein the conductive resin layer has a carbon nanotube content of about 0.5 vol % to about 10 vol %.

17. A method of manufacturing a multilayer ceramic electronic component, the method comprising:
forming a ceramic body including dielectric layers and internal electrodes;
forming electrode layers to be connected to the internal electrodes;
applying a conductive paste containing a first conductor, carbon nanotubes, and a base resin to the electrode layers; and
curing the conductive paste to form a conductive resin layer,
wherein the conductive resin layer contains the base resin and the carbon nanotubes at a volume ratio of base resin:carbon nanotubes of about 100:1 to about 100:20, and
wherein when diameters of the carbon nanotubes are defined as D, D is in a range of about 1 nm to about 100 nm.

18. A multilayer ceramic electronic component comprising:
a ceramic body including a plurality of alternating dielectric layers and internal electrodes;
a pair of opposing electrode layers connected to the internal electrodes; and
a conductive resin layer disposed on each of the electrode layers, the conductive resin layer comprising metal particles, carbon nanotubes, and a base resin,
wherein the conductive resin layer comprises about 33 vol % to about 60 vol % of the metal particles, and about 38 vol % to about 65 vol % of the base resin.

19. The multilayer ceramic electronic component of claim 18, wherein the conductive resin layer comprises about 0.5 vol % to about 10 vol % of the carbon nanotubes.

20. The multilayer ceramic electronic component of claim 18, wherein the conductive resin layer contains the base resin and the carbon nanotubes at a volume ratio of base resin:carbon nanotubes of about 100:1 to about 100:20.

21. The multilayer ceramic electronic component of claim 18, wherein the ratio of diameters (D) of the carbon nanotubes D and lengths (L) satisfy the relationship $L/D \geq 1.0$.

22. The multilayer ceramic electronic component of claim 18, wherein the diameters (D) of the carbon nanotubes satisfy the relationship $1\text{ nm} \leq D \leq 100\text{ nm}$.

23. A board having a multilayer ceramic electronic component mounted thereon, the board comprising:
a printed circuit board including first and second electrode pads formed on the printed circuit board; and
the multilayer ceramic electronic component of claim 18 mounted on the printed circuit board.

* * * * *